US006362467B1

(12) United States Patent
Bray

(10) Patent No.: US 6,362,467 B1
(45) Date of Patent: Mar. 26, 2002

(54) FAST-SWITCHING COMPARATOR WITH HYSTERESIS

(75) Inventor: Derek Bray, Los Altos, CA (US)

(73) Assignee: Infineon Technologies North America Corp., San Jose, CA (US)

(*) Notice: Subject to any disclaimer, the term of this patent is extended or adjusted under 35 U.S.C. 154(b) by 0 days.

(21) Appl. No.: 09/425,273

(22) Filed: Oct. 21, 1999

(51) Int. Cl.[7] .............................. H03R 5/24; H01J 40/14
(52) U.S. Cl. .................... 250/214 A; 327/206
(58) Field of Search ................. 250/214 R, 214 A, 250/214 C; 327/77, 87, 88, 89, 142, 198, 199, 205, 206, 207, 208; 326/87, 27; 330/85, 93

(56) References Cited

U.S. PATENT DOCUMENTS

| | | | |
|---|---|---|---|
| 3,725,673 A | * | 4/1973 | Frederiksen et al. ......... 327/89 |
| 5,122,690 A | * | 6/1992 | Bianchi ...................... 326/87 |
| 5,136,183 A | | 8/1992 | Moyal et al. ................ 307/355 |
| 5,202,553 A | * | 4/1993 | Geller ..................... 250/214 A |
| 5,880,611 A | * | 3/1999 | Danstrom ................... 327/142 |

FOREIGN PATENT DOCUMENTS

| EP | 0 429 829 A2 | 6/1991 |
|---|---|---|
| EP | 0 730 346 A2 | 9/1996 |

OTHER PUBLICATIONS

Patents Act 1977; Search Report under Section 17(5), The Patent Office Nov. 27, 2000 two pages.

* cited by examiner

Primary Examiner—John R. Lee
(74) Attorney, Agent, or Firm—Fish & Richardson P.C.

(57) ABSTRACT

Fast switching may be achieved in a comparator by driving a comparator stage with a gain amplifier and feeding back the output signal from the comparator to the gain amplifier.

11 Claims, 4 Drawing Sheets

FAST-SWITCHING COMPARATOR WITH HYSTERESIS

BACKGROUND OF THE INVENTION

A comparator may be used in an optocoupler driver-detector to sense the output of the driver. In a high-speed coupler, the comparator must not impose any significant delay.

DESCRIPTION OF THE INVENTION

A fast-switching comparator with hysteresis can be realized by driving a zero-hysteresis comparator stage with a current-limited differential gain amplifier and feeding back the output of the comparator stage through a current-limited differential amplifier to the gain amplifier.

Figure 1:
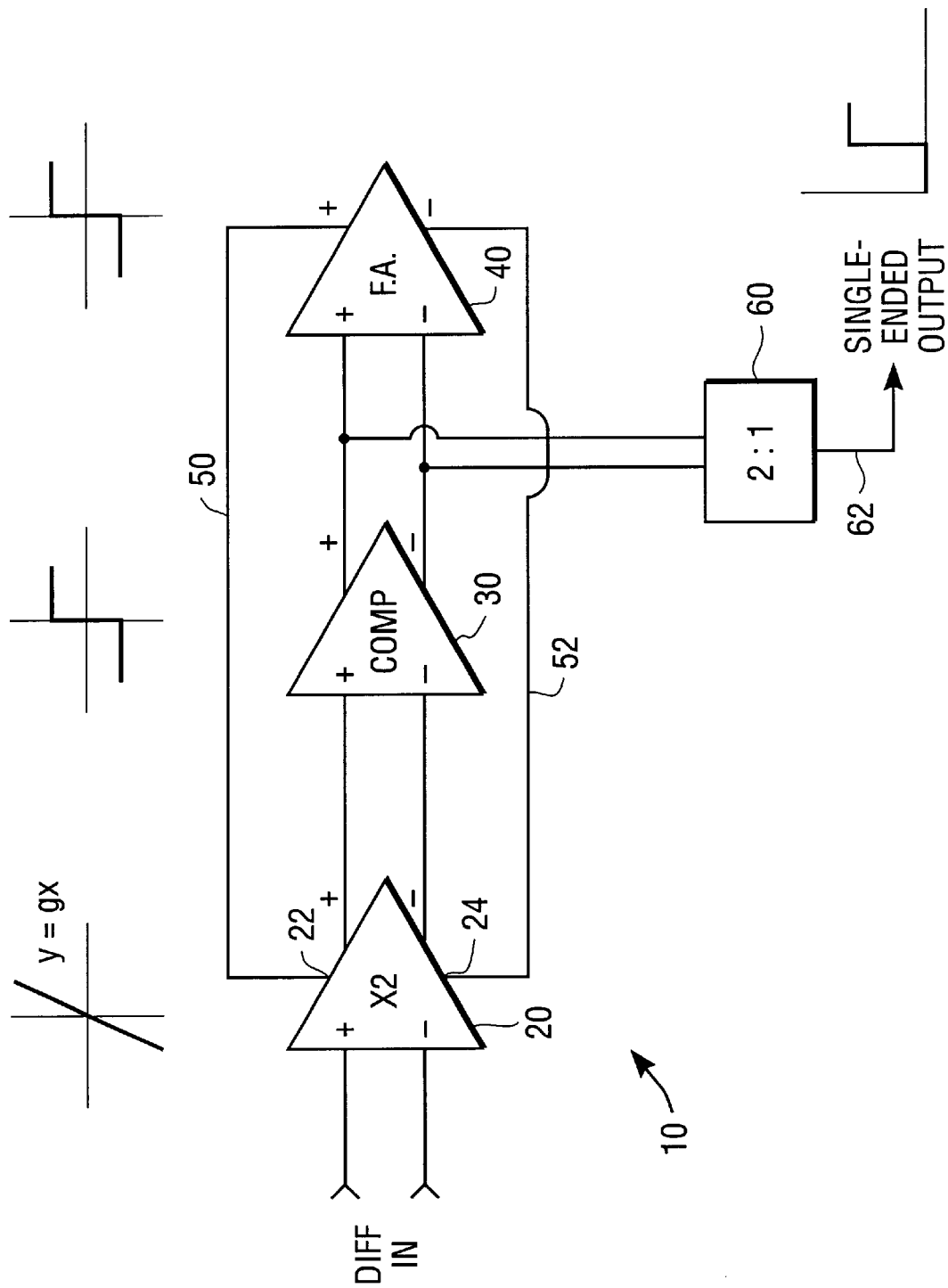
FIG. 1 is a conceptual schematic block diagram of a comparator.

A comparator 10 with hysteresis may be configured as shown in FIG. 1. There, a current-limited differential gain amplifier 20 with voltage compression drives a comparator stage 30, which in turn drives a current-limited differential switching amplifier 40, which for simplicity can also be referred to as a feedback amplifier 40. The outputs of the last-mentioned stage are provided to "positive-side" and "negative-side" active load inputs 22 and 24 in the gain amplifier 20, closing a feedback loop 50, 52. The output of the comparator 10 is derived from the outputs of the comparator stage 30 with a differential-to-single-ended converter 60 with a single-ended output 62.

The input signal is differential in format and is applied to the inputs of the gain amplifier 20. The amplified and compressed signal is then provided to the comparator stage 30, the output of which is converted to a single-ended output by the converter 60. In one configuration, the comparator stage 30 has very high gain with no hysteresis, and its output therefore is either high or low depending on the inputs.

For correct operation of the comparator 10, the feedback loop is positive. In FIG. 1, the three stages are shown to be non-inverting, but it should be recognized that one or more of the stages could invert the respective input signal and the connections would be appropriately made so as to maintain positive feedback.

Assume for the moment a scenario where the signal on the positive input of the comparator 10 and therefore the gain amplifier 20 is initially less that the signal on the negative input. In that case, the output of the gain amplifier 20 drives the output of the comparator stage 30 and the feedback amplifier 40 low (assuming a positive-negative terminal convention). The output of the feedback amplifier 40 is fed back to the active load inputs 22, 24 of the gain amplifier 20, biasing the active loads and reinforcing the low state.

Now assume that the signal on the positive input of the gain amplifier 20 begins to swing above the level of the signal on the negative input, until the positive side signal is greater than the negative side signal. When the signal difference exceeds the effect of the bias on the active loads in the gain amplifier 20, the outputs of the amplifier 20 will become equal, forcing the comparator stage 30 outputs to change polarity. In turn, the outputs of the feedback amplifier 40 switch, providing a reinforcing feedback signal to the gain amplifier 20.

Next, the signal on the positive input of the gain amplifier 20 begins to decrease, until it is less than the level of the signal on the negative input. When the signal difference exceeds the effect of the bias on the active loads in the gain amplifier 20, the outputs of the amplifier 20 will become equal, forcing the comparator stage 30 outputs to once again change polarity. In turn, the outputs of the feedback amplifier 40 switch, providing a reinforcing feedback signal of the new polarities to the gain amplifier 20.

Figure 2:
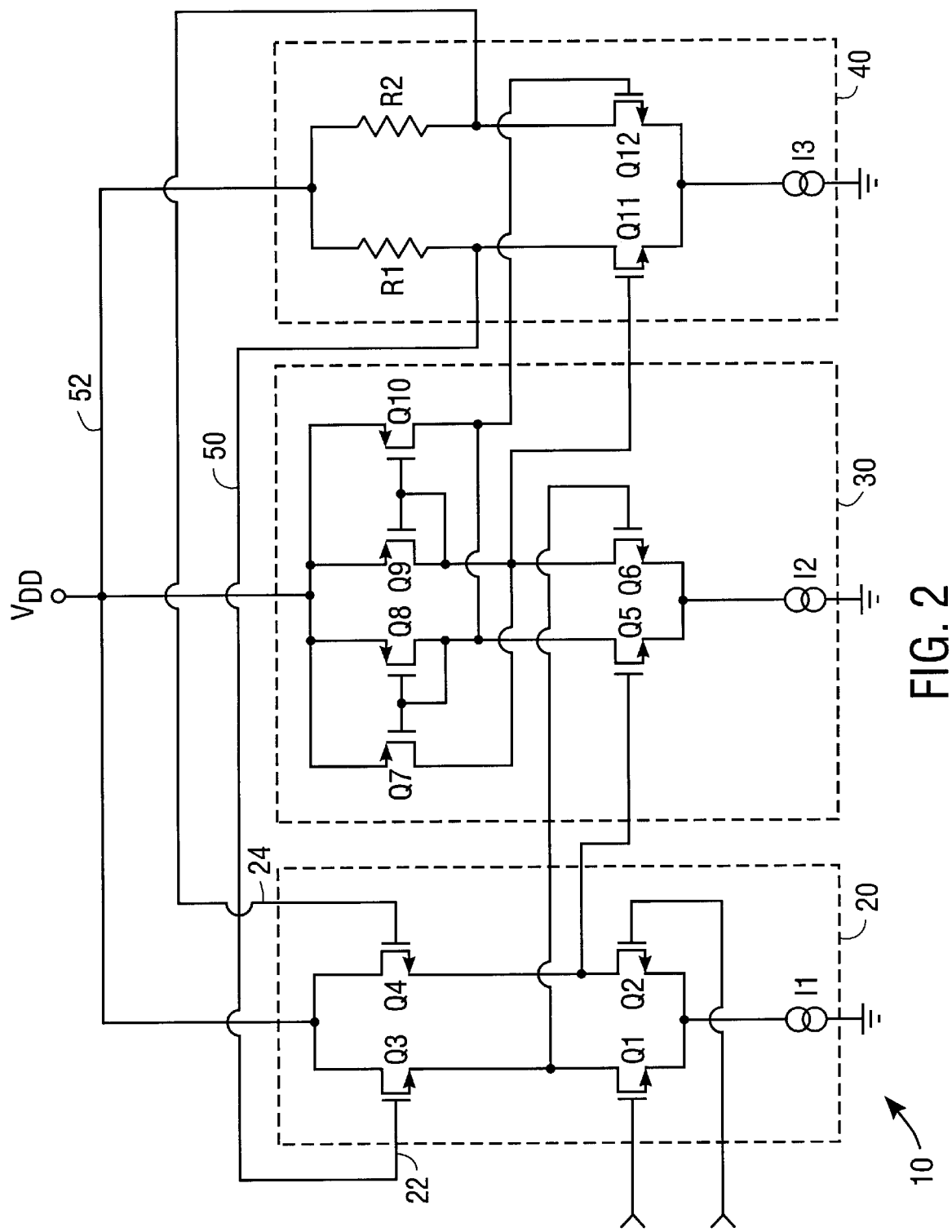
FIG. 2 is a schematic diagram of an implementation of the comparator circuit of FIG. 1.

An implementation of the circuit of FIG. 1 is shown in FIG. 2. The three stages of FIG. 1, namely, the gain amplifier 20, the comparator stage 30, and the current-limited differential switching or feedback amplifier 40, are indicated by components in the dashed lines. The first, the gain amplifier 20, has two devices Q1 and Q2, driving active loads Q3 and Q4, respectively. The current source 11 limits the current flowing through the amplifier 20.

The comparator stage 30 has input devices Q5 and Q6 cross-coupled to active loads Q7–Q8 and Q9–Q10. Each of the foregoing device pairs (Q7–Q8 and Q9–Q10) act as current mirrors. Nominally, the sizes (i.e., length and width) of all of the devices in the active loads are equal and there is no hysteresis. By varying the size (i.e., length and width) of one of the devices in a pair with respect to the other, a degree of hysteresis may be introduced. Current source 12 provides current to the comparator stage 30.

Lastly, the current-limited differential amplifier 40 has two devices Q11 and Q12 with load resistors R1 and R2. Current is limited by current source 13. The degree of hysteresis developed is the value of current from the current source 13 times the value of R1 or R2.

In the circuit of FIG. 2, devices Q1, Q2, Q3, Q4, Q5, Q6, Q11, and Q12 are shown as N-channel devices and Q7, Q8, Q9, and Q10 are depicted as P-channel devices. Other configurations could be employed and other devices (e.g., bipolar) could be employed.

Figure 3:
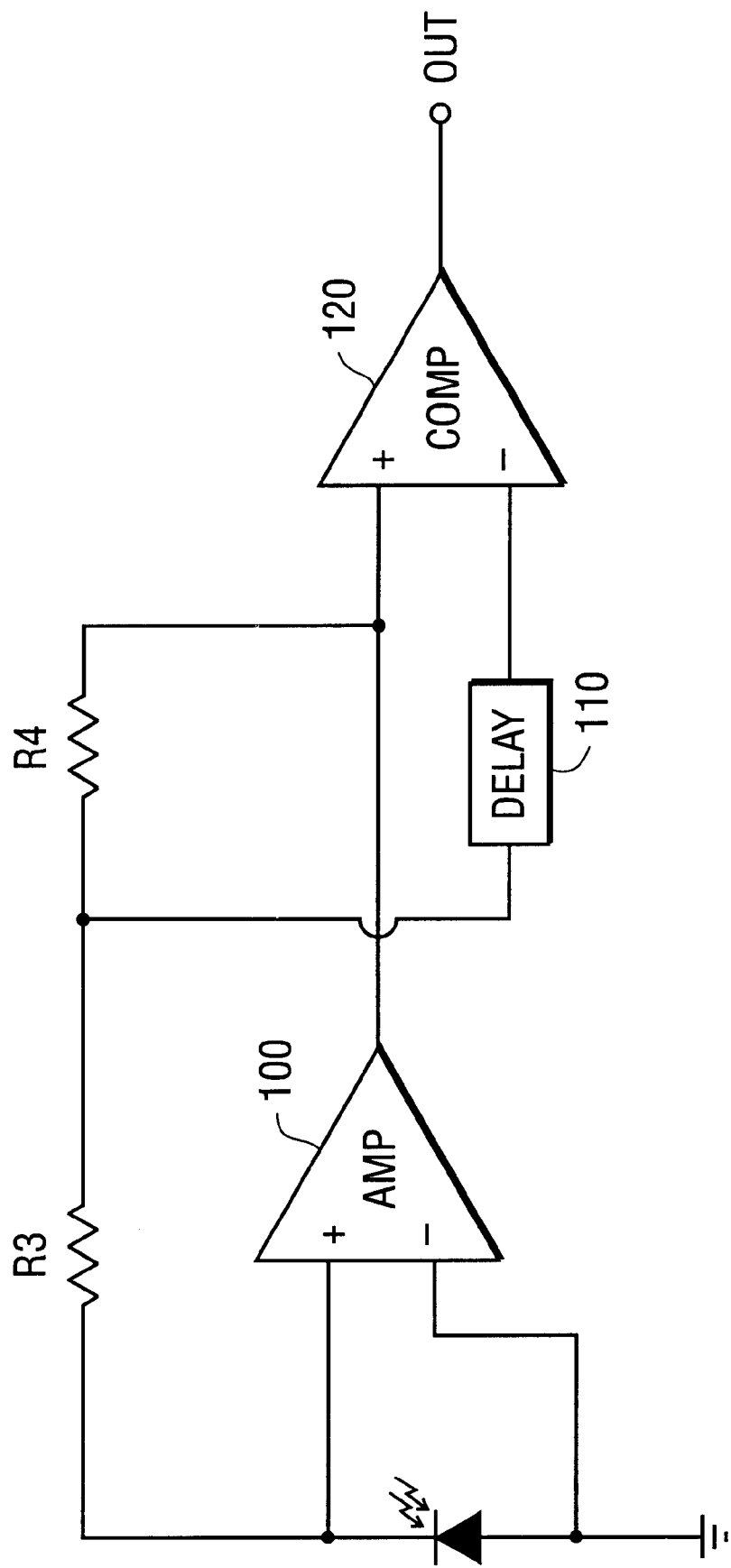
FIG. 3 is an optocoupler detector circuit that may utilize the comparator circuits of FIGS. 1 and 3.

The comparators of FIGS. 1 and 2 may be utilized in the optocoupler detectors described in U.S. patent application Ser. No. 09/342,804, for a High-Speed Optocoupler Detector, filed Jun. 29, 1999, and incorporated by reference herein. By way of example, a modification of the circuit of FIG. 3 of that application may be employed, and is illustrated in FIG. 3 here, showing the transimpedance amplifier 100, a delay 110, and a comparator 120. Here, the feedback resistor is split into R3 and R4, although it should be recognized that one might choose not to do so, and employ the circuit of FIG. 3 of the other application directly.

Figure 4:
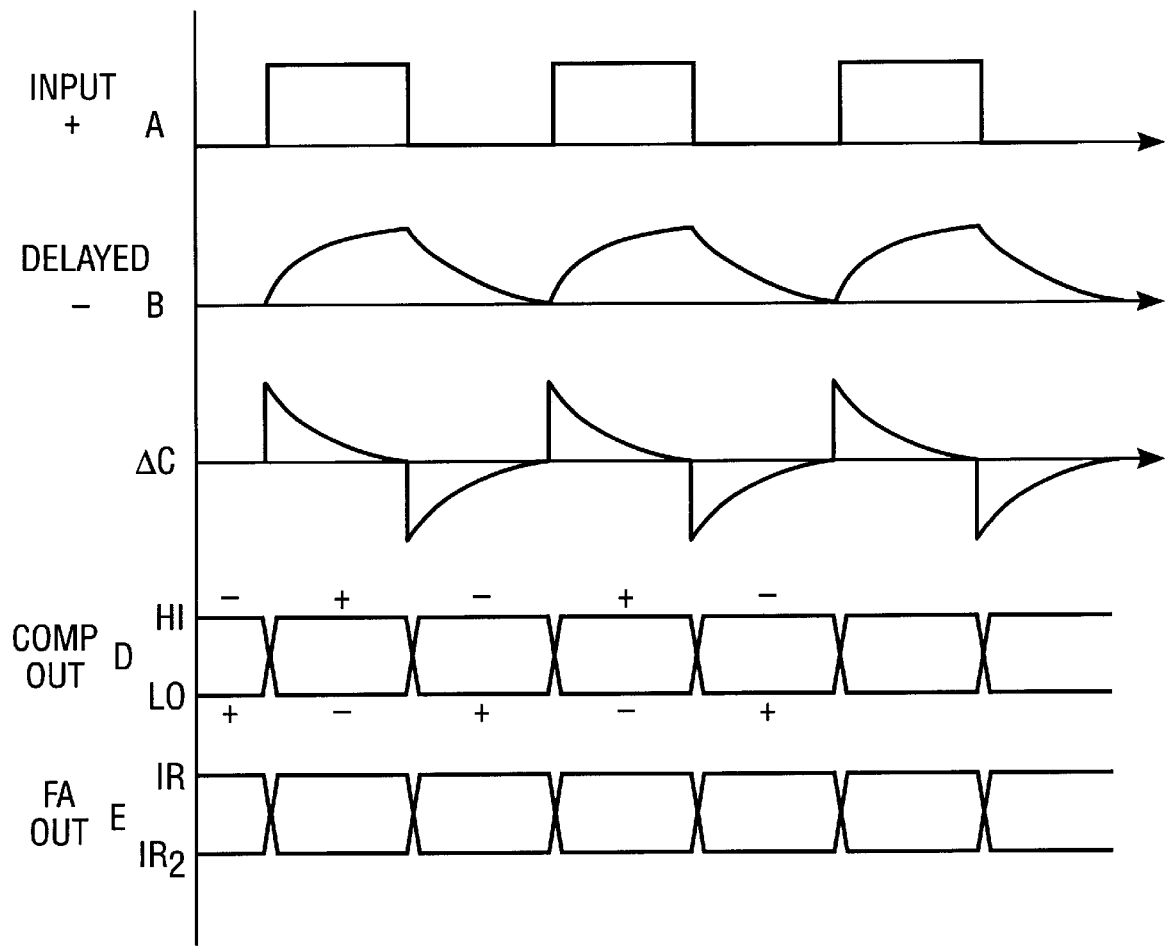
FIG. 4 is a waveform diagram for the circuits of FIGS. 1 and 2.

A set of waveforms for the comparator when employed in the circuit of FIG. 3 is shown in FIG. 4. The top waveform A is the positive input to the comparator 120, which is also the outputs of the photodiode and the amplifier 100 and the delayed signal at the negative input of the comparator 120 is the next waveform B. The difference between the two is the third waveform C. The outputs of the comparator stage is shown as waveform D and the current-limited outputs of the feedback amplifier 40 is the waveform E.

What is claimed is:

1. A comparator, comprising:
   a current-limited gain amplifier responsive to a differential input signal;
   a comparator stage responsive to the gain amplifier; and a current-limited differential feedback amplifier, responsive to the comparator stage and providing a positive feedback to the gain amplifier.

2. A comparator as set forth in claim 1, where the gain amplifier has active loads and the positive feedback biases the active loads.

3. A comparator as set forth in claim 1, where the comparator stage has high gain with no hysteresis.

4. A detector for a photo diode, comprising:

a current-to-voltage converter for converting the current output of a photo diode to a voltage; and a voltage change detector, responsive to the current-to-voltage converter, for detecting a change in the output of the photo diode, where the voltage change detector comprises means for retaining the voltage prior to a change in the output of the photo diode; and a comparator, responsive to the voltage change detector and the means for retaining the voltage prior to a change in the output of the photo diode, comprising
a current-limited gain amplifier responsive to a differential input signal;
a comparator stage responsive to the gain amplifier; and
a current-limited differential feedback amplifier, responsive to the comparator stage and providing a positive feedback to the gain amplifier.

5. A detector as set forth in claim 4, where the means for retaining the voltage prior to a change in the output of the photo diode comprises means for delaying the change in the reference voltage at the comparator for a period of time.

6. A detector as set forth in claim 5, where the means for delaying the change in the reference voltage at the comparator for a period of time is a delay line.

7. A detector as set forth in claim 4, where the current-to-voltage converter is a transimpedance amplifier.

8. A detector as set forth in claim 4, where the voltage change detector comprises means, responsive to the output of to the current-to-voltage converter, for generating a dynamic reference voltage, and a comparator responsive to the output of to the current-to-voltage converter and the dynamic reference voltage.

9. A detector as set forth in claim 8, where the means for generating a dynamic reference voltage comprises a voltage divider for sampling a portion of the output voltage of the current-to-voltage converter and a capacitor for retaining the sampled voltage for a period of time.

10. A detector as set forth in claim 8, where the means for generating a dynamic reference voltage comprises means for delaying the change in the reference voltage at the comparator for a period of time.

11. A detector as set forth in claim 10, where the means for delaying the change in the reference voltage at the comparator for a period of time is a delay line.

* * * * *